United States Patent
Li

(10) Patent No.: US 7,116,110 B1
(45) Date of Patent: Oct. 3, 2006

(54) SENSORLESS PROTECTION FOR ELECTRONIC DEVICE

(75) Inventor: Kang Li, Windsor (CA)

(73) Assignee: Yazaki North America, Inc., Canton, MI (US)

( * ) Notice: Subject to any disclaimer, the term of this patent is extended or adjusted under 35 U.S.C. 154(b) by 0 days.

(21) Appl. No.: 11/173,287

(22) Filed: Jun. 30, 2005

(51) Int. Cl.
G01R 31/08 (2006.01)
G01R 31/02 (2006.01)

(52) U.S. Cl. ...................... 324/522; 324/537
(58) Field of Classification Search ........... 324/522, 324/772, 537
See application file for complete search history.

(56) References Cited

U.S. PATENT DOCUMENTS

| | | | |
|---|---|---|---|
| 3,778,713 A | * | 12/1973 | Jamison ............ 324/766 |
| 4,633,358 A | | 12/1986 | Nagano |
| 4,654,568 A | | 3/1987 | Mansmann |
| 5,303,156 A | * | 4/1994 | Matsuoka et al. ........... 701/43 |
| 5,773,991 A | | 6/1998 | Chen |
| 2004/0228054 A1 | | 11/2004 | Shiotani |
| 2005/0231146 A1 | * | 10/2005 | De Frutos et al. ......... 318/434 |

* cited by examiner

*Primary Examiner*—Anjan Deb
*Assistant Examiner*—Amy He
(74) *Attorney, Agent, or Firm*—Harness, Dickey & Pierce, P.L.C.

(57) ABSTRACT

An electronic device with thermal fault protection wherein temperature sensors are not employed to detect an unbalanced thermal runaway condition. The device employs resistor networks to monitor a voltage differential that can be affected by transistor leakage currents. Configuration of the electronic device in this manner provides accurate and reliable fault protection from both unbalanced thermal runaway conditions and some manufacturing defects without the need for temperature sensors. A method is also provided.

19 Claims, 1 Drawing Sheet

SENSORLESS PROTECTION FOR ELECTRONIC DEVICE

The present invention generally relates to electronic devices with fault detection for a variety of faults, such as overtemperature detection and/or transistor failure and more particularly to an electronic device with a fault detection system for providing thermal protection and for identifying transistor failure that employs two resistor networks and a plurality of transistors to identify conditions in which an undesired temperature gradient has been applied to an electronic device.

With reference to FIG. 1 of the drawings, an electronic device having a thermal protection means is generally indicated by reference numeral 1. The thermal protection means includes a plurality of temperature sensing devices 2a, 2b, 2c and 2d, that are employed to sense the temperature of the electronic device 1 (e.g., the temperature of transistors Q1, Q2, Q3 and Q4, respectively) and responsively generate a sensor signal. A controller 3 receives the sensor signals and performs a predetermined action in response to a determination that one or more of the temperature sensing devices 2a, 2b, 2c and 2d has sensed a temperature in excess of a predetermined temperature.

Such thermal protection means can suffer from the following drawbacks: relatively sluggish in identifying a thermal runaway condition; relatively complex; typically rely on a fixed set point so as to undesirably employ a relatively large or small margin of safety; is highly dependent upon the accuracy of the temperature measurements; and/or have a relatively limited capability to identify situations where "hot spots" are generated due to manufacturing variation. Additionally, the protection provided by such thermal protection means may fail in situations where one or more of the power semiconductor devices (e.g., Q1, Q2, Q3 or Q4) in the electronic device 1 fail (i.e., short) prior to the operation of the electronic device 1. Accordingly, there remains a need in the art for an improved thermal runaway protection system.

SUMMARY

In one form, the present teachings provide a method that includes: providing an electronic device with a first potion and a second portion, the first portion including a first resistor network, a first group of transistors and a second group of transistors, the first resistor network being electrically disposed between a positive circuit leg and a negative circuit leg and coupled to the first and second groups of transistors at first and second intermediate points, respectively, each of the first and second groups of transistors including a first transistor and a second transistor coupled in series between the positive circuit leg and the negative circuit leg, the first intermediate point being disposed between the first and second transistors of the first group of transistors, the second intermediate point being disposed between the first and second transistors of the second group of transistors, the first resistor network providing a first output having a first voltage associated therewith, the second portion having a second resistor network electrically disposed between the positive circuit leg and the negative circuit leg, the second resistor network providing a second output having a second voltage associated therewith; switching a state of the first one of the first group of transistors and the second one of the second group of transistors to cause a leakage current in each of the first one of the first group of transistors and the second one of the second group of transistors, the leakage currents cooperating to affect the first voltage; and determining if a differential between the first voltage and the second voltage exceeds a first predetermined voltage differential.

In another form, the present teachings provide an electronic device having a first portion, a second portion, a comparator and a controller. The first portion has a first resistor network, a first group of transistors and a second group of transistors. The first resistor network is electrically disposed between a positive circuit leg and a negative circuit leg and is coupled to the first and second groups of transistors at first and second intermediate points, respectively. The first resistor network includes a first resistive device that has a first resistance which is disposed between the positive circuit leg and a network centerpoint, a second resistive device that has a second resistance and which is disposed between the network centerpoint and the first output, a third resistive device that has a third resistance and which is disposed between the first output and the negative circuit leg, a fourth resistive device that has a fourth resistance and which is disposed between the network centerpoint and the first intermediate point, and a fifth resistive device that has a fifth resistance and which is disposed between the network centerpoint and the second intermediate point. Each of the first and second groups of transistors includes a first transistor and a second transistor that are coupled in series between the positive circuit leg and the negative circuit leg. The first intermediate point is disposed between the first and second transistors of the first group of transistors. The second intermediate point is disposed between the first and second transistors of the second group of transistors. The first resistor network provides a first output having a first voltage associated therewith. The second portion has a second resistor network electrically disposed between the positive circuit leg and the negative circuit leg. The second resistor network provides a second output having a second voltage associated therewith. The second resistor network includes a sixth resistive device that has a sixth resistance and which is disposed between the positive circuit leg and the second output and a seventh resistive device that has a seventh resistance and which is disposed between the second output and the negative circuit leg. The comparator is coupled to the first and second outputs and is configured to produce an output that is based on a difference between the first voltage and the second voltage. The controller is coupled to the first and second transistors of the first and second groups of transistors and is configured to selectively switch a state of the first one of the first group of transistors and a state of the second one of the second group of transistors to cause a leakage current in each of the first one of the first group of transistors and the second one of the second group of transistors. The leakage currents cooperate to affect the first voltage.

In yet another form, the present teachings provide an electronic device with a first portion, a second portion, a comparator and a controller. The first portion has a first resistor network, a first group of transistors and a second group of transistors. The first resistor network is disposed between a positive circuit leg and a negative circuit leg and has a first intermediate point, a second intermediate point, and a first monitoring point. The first group of transistors including a first transistor, which is disposed between the positive circuit leg and the first intermediate point, and a second transistor, which is disposed between the first intermediate point and the negative circuit leg. The second group of transistors including a first transistor, which is disposed between the positive circuit leg and the second intermediate point, and a second transistor, which is disposed between the second intermediate point and the negative circuit leg. The second portion has a second resistor network that is coupled between the positive circuit leg and the negative circuit leg. The second portion has a second monitoring point. The comparator is coupled to the first and second monitoring points and is configured to provide an output signal in response to a situation where a voltage differential between a voltage at the first monitoring point and a voltage at the second monitoring point exceed a predetermined threshold. The controller is coupled to the first and second groups of transistors and configured to cooperate with the comparator to test the transistors to identify the occurrence of a group of faults that includes an unbalanced thermal runaway fault and fault wherein one or more of the transistors in the first and second groups of transistors has a high leakage current.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Additional advantages and features of the present invention will become apparent from the subsequent description and the appended claims, taken in conjunction with the accompanying drawings, wherein:

DETAILED DESCRIPTION OF THE VARIOUS EMBODIMENTS

Figure 2:
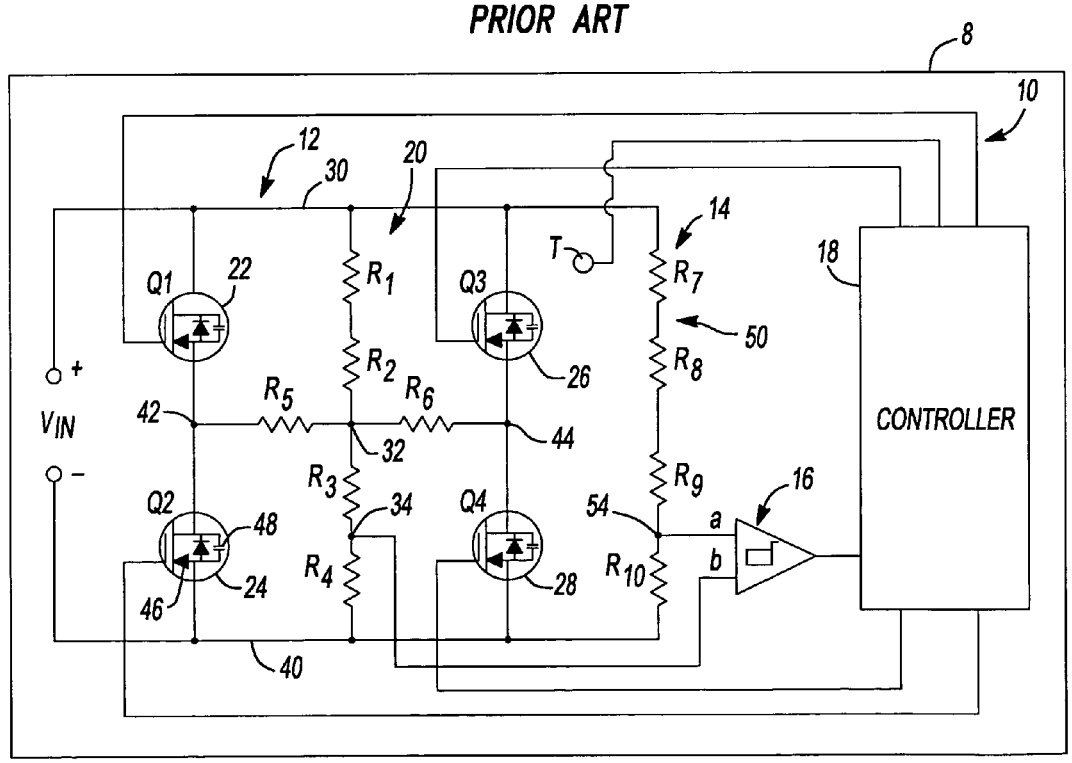
FIG. 2 is a schematic illustration of an electronic device having a fault detection system constructed in accordance with the teachings of the present invention.

With reference to FIG. 2 of the drawings, an electronic device 8 is illustrated to include a fault detection system 10 constructed in accordance with the teachings of the present invention. The fault detection system 10 can include a first portion 12, a second portion 14, a comparator 16 and a controller 18. The first portion 12 can include a first resistor network 20 and a plurality of transistors (e.g., 22, 24, 26 and 28). In the particular example provided, the electronic device 8 includes a switching controller for controlling the operation of a DC electric motor (not shown) and the transistors 22, 24, 26 and 28 are employed to control the operation (i.e., on/off and the speed) of the motor as well as its direction (i.e., clockwise or counter-clockwise rotation). Accordingly, those of ordinary skill in the art will appreciate that the transistors 22, 24, 26 and 28 can construct a single phase H-bridge circuit. Depending on the particular application, one or more pairs of transistors can be added to form a multi-phase H-bridge circuit. In such cases, a corresponding first resistor network 20 and a corresponding comparator 16 can be employed to implement fault protection for each additional phase.

The first resistor network 20 can include a plurality of resistors (e.g., R1 through R6). The resistors R1 and R2, which form a first resistive device, can be coupled in series between a positive circuit leg 30 and an electric centerpoint 32 of the first resistor network 20. The resistor R3 can be disposed between the centerpoint 32 and a first monitoring point 34. The resistor R4 can couple the first monitoring point 34 to a negative circuit leg 40. The resistors R5 and R6 can be coupled to the centerpoint 32 on a first side and to a respective one of the first and second intermediate points 42 and 44, respectively. As those of ordinary skill in the art will appreciate from this disclosure, one or more electric loads (not shown) are coupled to the first and second intermediate points 42 and 44.

The transistors 22, 24, 26 and 28 can be any appropriate type of transistor but in the example provided are metal oxide semiconductor field effect transistors (MOSFET's). Each transistor 22, 24, 26, 28 can include a body diode 46 and a parasitic output capacitor 48. The transistors 22, 24, 26, 28 can be coupled in groups, such as pairs, between the positive circuit leg 30 and the negative circuit leg 40. In the particular example provided, the transistor 22 is coupled to the positive circuit leg 30 and the first intermediate point 42, while the transistor 24 is coupled to the first intermediate point 42 and the negative circuit leg 40. Similarly, the transistor 26 is coupled to the positive circuit leg 30 and the second intermediate point 44, while the transistor 28 is coupled to the second intermediate point 44 and the negative circuit leg 40. Each of the transistors 22, 24, 26, 28 can be coupled to the controller 18 so that the controller 18 can selectively change the state of the transistor between a state that permits the transmission of electrical energy therethrough and a state that inhibits the transmission of electrical energy therethrough.

The second portion 14 can include a second resistor network 50. In the example provided, the second resistor network 50 includes a plurality of resistors (R7, R8 and R9), which are connected in series between the positive circuit leg 30 and a second monitoring point 54, and a resistor R10 that is coupled between the second monitoring point 54 and the negative circuit leg 40.

The ratio of the sum of the resistances R1, R2 and R3 to the resistance R4 can be about equal to the ratio of the sum of the resistances R7, R8 and R9 to the resistance R10. In the particular example provided, the resistance of resistors R1 and R7 is about equal, the resistance of resistors R2 and R8 is about equal, the resistance of the resistors R3 and R9 is about equal, the resistance of the resistors R4 and R10 is about equal, and the resistance of the resistors R5 and R6 is about equal. Additionally, the resistance of the resistors R1 and R3 can be about equal and the resistance of the resistors R2 and R4 can be about equal.

The comparator 16 can be conventionally constructed and is employed to compare the voltage at the first monitoring point 34 to the voltage at the second monitoring point 54 and responsively generate a comparator output signal. The comparator output signal is received by the controller 18, which is configured to responsively control the transistors 22, 24, 26 and 28.

Under normal steady-state off operation of the transistors 22, 24, 26, 28 (i.e., the transistors 22, 24, 26 and 28 are operated in a mode that does not conduct electricity therethrough), the voltage at the first and second intermediate points 42 and 44 is one half the value of the input voltage due to the parasitic capacitors 48. Moreover, the resistors R1 through R6 of the first resistor network 20 can cooperate to maintain the voltage at the first and second intermediate points 42 and 44 even if there is a slight imbalance on the transistors 22, 24, 26 and 28 in the steady state off condition. Consequently, the voltage at the first monitoring point 34 is equal to the voltage at the second monitoring point 54 and the comparator 16 can output a comparator output signal that can correspond to a logical low (i.e., logical zero (0)), for example.

In the case where one or more of the transistors 22, 24, 26, 28 that are not located in the same group fail short, the voltage at the first and second intermediate points 42 and 44 will not be maintained at the aforementioned level and thus the voltage at the first monitoring point 34 will be different from the voltage at the second monitoring point 54. If the voltage differential exceeds a predetermined threshold, the comparator 16 will generate an appropriate comparator output signal, such as a comparator output signal that corresponds to a logical high (i.e., a logical one (1)), thereby informing the controller 18 of the occurrence of the condition so that the controller 18 may take an appropriate action (e.g., to protect the circuitry and load).

Advantageously, the transistors 22, 24, 26, 28 may be operated in a switching-state mode wherein pairs of the transistors 22, 28 and 24, 26 are selectively turned on and off to permit electrical energy transmitted through the transistors 22, 24, 26, 28 to be modulated. This testing may be performed on a periodic basis (i.e., either at predetermined intervals or at random intervals) or on the occurrence of a predetermined condition.

For example, the transistors 22 and 28 can be turned on while the transistors 24 and 26 remain off, thus causing the first intermediate point 42 to be coupled to the positive circuit leg 30 and the second intermediate point 44 to be coupled to the negative circuit leg 40. Under normal circumstances, the voltage at the centerpoint 32 will remain at one half the value of the input voltage and consequently, the voltage at the first monitoring point 34 will be equal to the voltage at the second monitoring point 54. Thus, the comparator 16 can output a comparator output signal that can correspond to a logical low (i.e., logical zero (0)), for example.

Thereafter, the transistors 22 and 28 can be turned off while the transistors 24 and 26 remain off. During the transition, the parasitic capacitors 48 associated with the transistors 22 and 28 will charge up, causing the voltage at the first intermediate point 42 to fall and the voltage at the second intermediate point 44 to rise. In normal operation, the rates of fall and rise are about equal and due to the resistors R5 and R6, the voltage at the centerpoint 32 will remain at one half of the value of the input voltage. Accordingly, the voltage at the first monitoring point 34 is equal to the voltage at the second monitoring point 54 and the comparator 16 can output a comparator output signal that can correspond to a logical low (i.e., logical zero (0)), for example.

In situations where the operational temperature of the transistors 22 and 28 is significantly different, the transistor with the higher temperature will have a higher leakage current in the off state since the leakage current of the transistor is a function of its junction temperature. Since a high leakage current will slow the rate at which the parasitic capacitor 48 charges, the voltage fall at the first intermediate point 42 will not cancel the voltage rise at the second intermediate point 44, thus causing a voltage differential between the first and second monitoring points 34 and 54. In practice, the higher the junction temperature, the higher the leakage current and the larger the voltage differential between the first and second monitoring points 34 and 54. In situations where the rate of change in the fall and rise of the voltage at the first and second intermediate points 42 and 44 is sufficiently different, the voltage differential between the first and second monitoring points 34 and 54 will exceed the predetermined threshold and the comparator 16 will output an appropriate comparator output signal, such as a comparator output signal that corresponds to a logical high (i.e., a logical one (1)), thereby informing the controller 18 of the occurrence of the condition so that the controller 18 may take an appropriate action (e.g., to protect the circuitry and load).

It will be appreciated that the process may then be repeated for another two of the transistors 22, 24, 26, 28. In the example provided, the transistors 24 and 26 can be turned on while the transistors 22 and 28 remain off. Under normal circumstances, operation of the transistors 22, 24, 26, 28 in this manner will cause the first intermediate point 42 to be coupled to the negative circuit leg 40 and the second intermediate point 44 to be coupled to the positive circuit leg 30. In such situation, the voltage at the centerpoint 32 will remain at one half the value of the input voltage and consequently, the voltage at the first monitoring point 34 is equal to the voltage at the second monitoring point 54. Thus, the comparator 16 can output a comparator output signal that can correspond to a logical low (i.e., logical zero (0)), for example.

Thereafter, the transistors 24 and 26 can be turned off while the transistors 22 and 28 remain off. During the transition, the parasitic capacitors 48 associated with the transistors 24 and 26 will charge up, causing the voltage at the first intermediate point 42 to rise and the voltage at the second intermediate point 44 to fall. In normal operation, the rates of rise and fall are about equal and due to the resistors R5 and R6, the voltage at the centerpoint 32 will remain at one half of the value of the input voltage. Accordingly, the voltage at the first monitoring point 34 is equal to the voltage at the second monitoring point 54 and the comparator 16 can output a comparator output signal that can correspond to a logical low (i.e., logical zero (0)), for example.

In situations where the operational temperature of the transistors 24 and 26 is significantly different, the transistor with the higher temperature will have a higher leakage current in the off state since the leakage current of the transistor is a function of its junction temperature as noted above. In situations where the rate of change in the rise and fall of the voltage at the first and second intermediate points 42 and 44 is sufficiently different, the voltage differential between the first and second monitoring points 34 and 54 will exceed the predetermined threshold and the comparator 16 will output an appropriate comparator output signal, such as a comparator output signal that corresponds to a logical high (i.e., a logical one (1)), thereby informing the controller 18 of the occurrence of the condition so that the controller 18 may take an appropriate action (e.g., to protect the circuitry and load).

Figure 1:
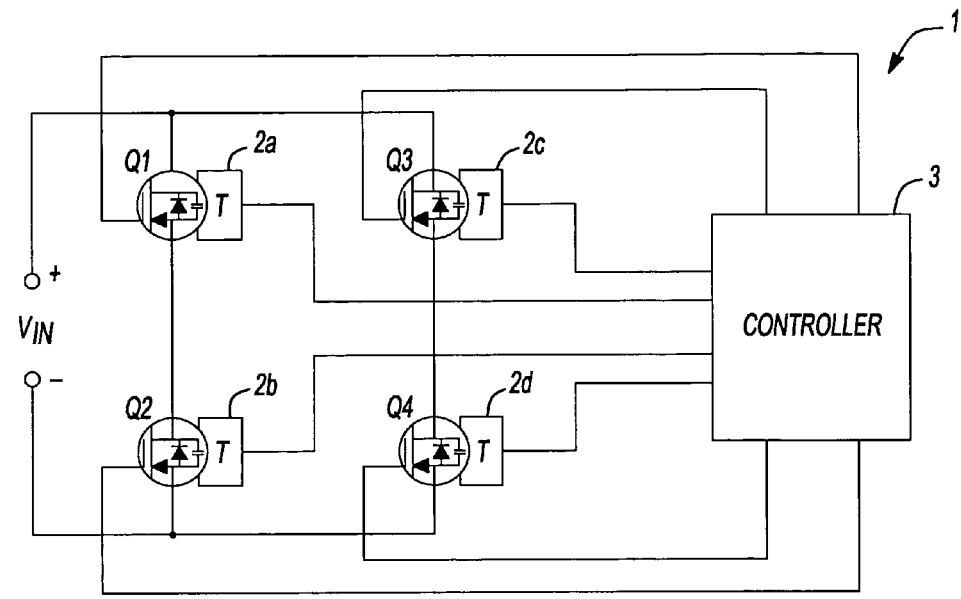
FIG. 1 is a schematic illustration of an electronic device having a prior art thermal protection means.

In practice, it is possible that one or more of the transistors 22, 24, 26, 28 may be manufactured with a flaw such that it has a relatively high leakage current or has a junction "hot spot" when carrying current. The fault detection system 10 will detect these flaws, since they will cause a voltage imbalance between the first and second intermediate points 42 and 44. Accordingly, the fault detection system 10 is something of a diagnostic tool that will detect problems and prevent early failures of other circuitry and the load. By way of comparison, the thermal protection means of FIG. 1 cannot detect a fault condition until the transistors Q1, Q2, Q3, Q4 (FIG. 1) are operated in an electrically-conductive mode to carry current and overheat.

Those of ordinary skill in the art will appreciate that the protection provided by the fault detection system 10 is not dependent upon the accuracy of a temperature measurement (e.g., from a temperature sensor) and as such, the protection will not fail where one or more of the transistors 22, 24, 26, 28 fail (i.e., short) prior to operation of the electronic device 8.

Those of ordinary skill in the art will also appreciate that the fault detection system 10 will not detect a balanced runaway situation (i.e., where all of the transistors 22, 24, 26, 28 have junction temperatures that are relatively close so that the voltage differential between the first and second monitoring points 34 and 54 does not exceed the predetermined threshold despite even where the junction temperature exceeds a predetermined temperature). Such balanced thermal runaway conditions may be extremely rare and as such, it may not be necessary to guard against this condition. In situations where one might desire to protect against a balanced thermal runaway condition, an appropriate sensor, such as a temperature sensor T, may be employed to generate a temperature sensor signal in response to a temperature of the fault detection system 10 for example. The temperature sensor signal may be received by the controller 18, permitting the controller 18 to take an appropriate action if the temperature that is sensed by the temperature sensor exceeds a predetermined temperature.

While the invention has been described in the specification and illustrated in the drawings with reference to various embodiments, it will be understood by those of ordinary skill in the art that various changes may be made and equivalents may be substituted for elements thereof without departing from the scope of the invention as defined in the claims. Furthermore, the mixing and matching of features, elements and/or functions between various embodiments is expressly contemplated herein so that one of ordinary skill in the art would appreciate from this disclosure that features, elements and/or functions of one embodiment may be incorporated into another embodiment as appropriate, unless described otherwise, above. Moreover, many modifications may be made to adapt a particular situation or material to the teachings of the invention without departing from the essential scope thereof. Therefore, it is intended that the invention not be limited to the particular embodiment illustrated by the drawings and described in the specification as the best mode presently contemplated for carrying out this invention, but that the invention will include any embodiments falling within the foregoing description and the appended claims.

What is claimed is:

1. A method comprising:
   providing an electronic device with a first portion and a second portion, the first portion including a first resistor network, a first group of transistors and a second group of transistors, the first resistor network being electrically disposed between a positive circuit leg and a negative circuit leg and coupled to the first and second groups of transistors at first and second intermediate points, respectively, each of the first and second groups of transistors including a first transistor and a second transistor coupled in series between the positive circuit leg and the negative circuit leg, the first intermediate point being disposed between the first and second transistors of the first group of transistors, the second intermediate point being disposed between the first and second transistors of the second group of transistors, the first resistor network providing a first output having a first voltage associated therewith, the second portion having a second resistor network with a first end, which is coupled to the positive circuit leg, and a second end, which is coupled to the negative circuit leg, the second resistor network providing a second output having a second voltage associated therewith;
   switching a state of the first one of the first group of transistors and the second one of the second group of transistors, wherein a temperature imbalance on the first one of the first group of transistors and the second one of the second group of transistors causes a leakage current imbalance in the first and second groups of transistors, the leakage currents cooperating to affect the first voltage; and
   determining if a differential between the first voltage and the second voltage exceeds a first predetermined voltage differential.

2. The method of claim 1, further comprising:
   switching a state of the second one of the first group of transistors and the first one of the second group of transistors, wherein a temperature imbalance on the second one of the first group of transistors and the first one of the second group of transistors causes a leakage current imbalance in the first and second groups of transistors, the leakage current imbalance cooperating to affect the first voltage; and
   determining if the differential between the first voltage and the second voltage exceeds a second predetermined voltage differential.

3. The method of claim 2, wherein the first predetermined voltage differential is equal to the second predetermined voltage differential.

4. The method of claim 2, wherein each of the first and second transistors of the first and second groups of transistors is operable in an electrically conducting state and an electrically non-conducting state, and wherein the method further comprises:
   maintaining each of the first and second transistors of the first and second groups of transistors in the electrically non-conducting state; and
   determining if the differential between the first voltage and the second voltage exceeds a third predetermined voltage differential.

5. The method of claim 4, wherein the third predetermined voltage differential is about equal to the first predetermined voltage differential.

6. A method comprising:
   providing an electronic device with a first portion and a second portion, the first portion including a first resistor network, a first group of transistors and a second group of transistors, the first resistor network being electrically disposed between a positive circuit leg and a negative circuit leg and coupled to the first and second groups of transistors at first and second intermediate points, respectively, each of the first and second groups of transistors including a first transistor and a second transistor coupled in series between the positive circuit leg and the negative circuit leg, the first intermediate point being disposed between the first and second transistors of the first group of transistors, the second intermediate point being disposed between the first and second transistors of the second group of transistors, the first resistor network providing a first output having a first voltage associated therewith, the second portion having a second resistor network electrically disposed between the positive circuit leg and the negative circuit leg, the second resistor network providing a second output having a second voltage associated therewith;
   switching a state of the first one of the first group of transistors and the second one of the second group of transistors, wherein a temperature imbalance on the first one of the first group of transistors and the second one of the second group of transistors causes a leakage current imbalance in the first and second groups of transistors, the leakage currents cooperating to affect the first voltage; and determining if a differential between the first voltage and the second voltage exceeds a first predetermined voltage differential;

wherein the first resistor network includes a first resistive device that is disposed between the positive circuit leg and a network centerpoint, a second resistive device that is disposed between the network centerpoint and the first output and a third resistive device that is disposed between the first output and the negative circuit leg, the first resistive device having a first resistance, the second resistive device having a second resistance and the third resistive device having a third resistance;

wherein the second resistor network includes a fourth resistive device that is disposed between the positive circuit leg and the second output and a fifth resistive device that is disposed between the second output and the negative circuit leg, the fourth resistive device having a fourth resistance and the fifth resistive device having a fifth resistance; and wherein a ratio of the sum of the first and second resistances to the third resistance is equal to a ratio of fourth resistance to the fifth resistance.

7. The method of claim 6, wherein the sixth resistive device that is disposed between the network centerpoint and the first intermediate point and a seventh resistive device that is disposed between the network centerpoint and the second intermediate point, the sixth resistive device having a sixth resistance, and the seventh resistive device having a seventh resistance that is about equal the sixth resistance.

8. An electronic device comprising:

a first portion having a first resistor network, a first group of transistors and a second group of transistors, the first resistor network being electrically disposed between a positive circuit leg and a negative circuit leg and coupled to the first and second groups of transistors at first and second intermediate points, respectively, the first resistor network includes a first resistive device that is disposed between the positive circuit leg and a network centerpoint, a second resistive device that is disposed between the network centerpoint and a first output, a third resistive device that is disposed between the first output and the negative circuit leg, a fourth resistive device that is disposed between the network centerpoint and the first intermediate point, and a fifth resistive device that is disposed between the network centerpoint and the second intermediate point, the first resistive device having a first resistance, the second resistive device having a second resistance, the third resistive device having a third resistance, the fourth resistive device having a fourth resistance and the fifth resistive device having a fifth resistance, each of the first and second groups of transistors including a first transistor and a second transistor coupled in series between the positive circuit leg and the negative circuit leg, the first intermediate point being disposed between the first and second transistors of the first group of transistors, the second intermediate point being disposed between the first and second transistors of the second group of transistors, the first resistor network providing a first output having a first voltage associated therewith;

a second portion having a second resistor network electrically disposed between the positive circuit leg and the negative circuit leg, the second resistor network providing a second output having a second voltage associated therewith, the second resistor network including a sixth resistive device being disposed between the positive circuit leg and the second output and a seventh resistive device being disposed between the second output and the negative circuit leg, the sixth resistive device having a sixth resistance and the seventh resistive device having a seventh resistance;

a comparator coupled to the first and second outputs and being configured to produce an output that is based on a difference between the first voltage and the second voltage; and a controller coupled to the first and second transistors of the first and second groups of transistors, the controller being configured to selectively switch a state of the first one of the first group of transistors and a state of the second one of the second group of transistors, wherein a temperature imbalance on the first one of the first group of transistors and the second one of the second group of transistors causes a leakage current imbalance in the first and second groups of transistors, the leakage current imbalance cooperating to affect the first voltage.

9. The electronic device of claim 8, wherein the controller is further configured to selectively switch a state of the second one of the first group of transistors and a state of a first one of the second group of transistors, wherein a temperature imbalance on the second one of the first group of transistors and the first one of the second group of transistors causes a leakage current imbalance in the first and second groups of transistors, the leakage current imbalance cooperating to affect the first voltage.

10. The electronic device of claim 9, wherein a ratio of the sum of the first and second resistances to the third resistance is about equal to a ratio of sixth resistance to the seventh resistance.

11. The electronic device of claim 9, wherein the fourth resistance is equal to the fifth resistance.

12. A method comprising:

providing an electronic device with a first portion and a second portion, the first portion including a first resistor network, a first group of transistors and a second group of transistors, the first resistor network being electrically disposed between a positive circuit leg and a negative circuit leg and coupled to the first and second groups of transistors at first and second intermediate points, respectively, each of the first and second groups of transistors including a first transistor and a second transistor coupled in series between the positive circuit leg and the negative circuit leg, the first intermediate point being disposed between the first and second transistors of the first group of transistors, the second intermediate point being disposed between the first and second transistors of the second group of transistors, the first resistor network providing a first output having a first voltage associated therewith, the second portion having a second resistor with a first end, which is coupled to the positive circuit leg, and a second end, which is coupled to the negative circuit leg, the second resistor network providing a second output having a second voltage associated therewith;

controlling the first and second transistors of the first and second groups of transistors in a predetermined manner; and determining if a differential between the first voltage and the second voltage exceeds a predetermined voltage differential.

13. A method comprising:
providing an electronic device with a first portion and a second portion, the first portion including a first resistor network, a first group of transistors and a second group of transistors, the first resistor network being electrically disposed between a positive circuit leg and a negative circuit leg and coupled to the first and second groups of transistors at first and second intermediate points, respectively, each of the first and second groups of transistors including a first transistor and a second transistor coupled in series between the positive circuit leg and the negative circuit leg, the first intermediate point being disposed between the first and second transistors of the first group of transistors, the second intermediate point being disposed between the first and second transistors of the second group of transistors, the first resistor network providing a first output having a first voltage associated therewith, the second portion having a second resistor network electrically disposed between the positive circuit leg, and the negative circuit leg, the second resistor network providing a second output having a second voltage associated therewith;

controlling the first and second transistors of the first and second groups of transistors in a predetermined manner; and determining if a differential between the first voltage and the second voltage exceeds a predetermined voltage differential;

wherein a parasitic capacitor is associated with each of the first and second transistors of the first and second groups of transistors and wherein controlling the first and second transistors of the first and second groups of transistors in the predetermined manner includes:

selecting a first set of transistors and a second set of transistors, the selected first set of transistors including the first transistor of the first group of transistors and the second transistor of the second group of transistors or the second transistor of the first group of transistors and the first transistor of the second group of transistors, the selected second set of transistors including the first and second transistors of the first and second groups of transistors that are not included in the first set of transistors; and switching a state of the first set of transistors to compare a function that is related to a leakage current associated with each of the transistors of the selected first set of transistors, the leakage current being related to the temperature of the transistors; and wherein the first voltage is related to a rate at which the parasitic capacitors of the selected first set of transistors charge or discharge.

14. The method of claim 13, wherein controlling the first and second transistors of the first and second groups of transistors in the predetermined manner further includes:
switching a state of the second set of transistors to compare a function that is related to a leakage current associated with each of the transistors of the second set of transistors, the leakage current is related to the temperature of the transistors;
wherein the first voltage is related to a rate at which the parasitic capacitors of the second set of transistors charge or discharge.

15. The method of claim 14, wherein controlling the first and second transistors of the first and second groups of transistors in the predetermined manner further includes:
operating each of the transistors of the selected first set of transistors and the second set of transistors in a state wherein electricity is not conducted therethrough.

16. An electronic device comprising:
a first portion with a first resistor network, a first group of transistors and a second group of transistors, the first resistor network being disposed between a positive circuit leg and a negative circuit leg and having a network centerpoint, a first intermediate point, a second intermediate point, and a first monitoring point, the first group of transistors including a first transistor, which is disposed between the positive circuit leg and the first intermediate point, and a second transistor, which is disposed between the first intermediate point and the negative circuit leg, the second group of transistors including a first transistor, which is disposed between the positive circuit leg and the second intermediate point, and a second transistor, which is disposed between the second intermediate point and the negative circuit leg;

a second portion with a second resistor network having first end, which is coupled to the positive circuit leg, and a second end, which is coupled to the negative circuit leg, the second portion having a second monitoring point;

a comparator coupled to the first and second monitoring points, the comparator being configured to provide an output signal in response to a situation where a voltage differential between a voltage at the first monitoring point and a voltage at the second monitoring point exceed a predetermined threshold; and a controller coupled to the first and second groups of transistors, the controller being configured to cooperate with the comparator to test the first and second portions to identify the occurrence of a group of faults including an unbalanced thermal runaway fault, a fault wherein one or more of the transistors in the first and second groups of transistors has a high leakage current, and a short.

17. The electronic device of claim 16, further comprising a temperature sensor coupled to the first portion, the temperature sensor providing a sensor output that is received by the controller, the controller being further operable for identifying a balanced thermal runaway fault.

18. A method comprising:
providing an electronic device with a first group of transistors, a second group of transistors and a protection system having a first resistor network, a second resistor network, a comparator that is configured to receive a first output of the first resistor network and a second output of the second resistor network, and a controller that is coupled to the comparator and the transistors of the pairs of first and second transistors; the first resistor network being disposed between a positive circuit leg and a negative circuit leg, the second resistor network having first end, which is coupled to the positive circuit leg, and a second end, which is coupled to the negative circuit leg; and employing the protection system to detect a high leakage current condition, a short condition, or both in one or more of the transistors of the first and second groups of transistors prior to operating the electronic device such that two or more of the transistors are operated in a state that is electrically conductive.

19. The method of claim 18, wherein a voltage difference between the first and second intermediate points is related to the high leakage current or short condition in one or more of the transistors of the first and second groups of transistors, a voltage of the first output is related to a voltage difference between the first and second intermediate points, and an output of the comparator is related to a voltage of the first output.

* * * * *

UNITED STATES PATENT AND TRADEMARK OFFICE
CERTIFICATE OF CORRECTION

PATENT NO. : 7,116,110 B1 Page 1 of 1
APPLICATION NO. : 11/173287
DATED : October 3, 2006
INVENTOR(S) : Kang Li It is certified that error appears in the above-identified patent and that said Letters Patent is hereby corrected as shown below:

Column 8, line 39, delete "about"

Column 9, line 33, delete "about"

Column 10, line 37, delete "about"

Column 10, line 60, after "resistor" insert -- network --

Column 11, line 23, delete ","

Column 11, line 25, "." should be -- ; --

Signed and Sealed this

Sixth Day of March, 2007

JON W. DUDAS
*Director of the United States Patent and Trademark Office*